United States Patent
Wu et al.

(10) Patent No.: US 7,290,231 B2
(45) Date of Patent: Oct. 30, 2007

(54) METHOD FOR REDUCING STANDARD DELAY FORMAT FILE SIZE

(75) Inventors: Kun-Cheng Wu, Hsinchu (TW); Chien-Ming Huang, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 134 days.

(21) Appl. No.: 10/710,420

(22) Filed: Jul. 9, 2004

(65) Prior Publication Data
US 2005/0177806 A1    Aug. 11, 2005

(30) Foreign Application Priority Data
Feb. 10, 2004  (TW) .............................. 93103001 A

(51) Int. Cl.
*G06F 17/50*     (2006.01)
*G06F 9/45*      (2006.01)

(52) U.S. Cl. .............................................. 716/6; 716/2
(58) Field of Classification Search .................... 716/2, 716/4–6, 10; 703/14
See application file for complete search history.

(56) References Cited

U.S. PATENT DOCUMENTS

| 6,857,110 B1* | 2/2005 | Rupp et al. ..................... 716/4 |
| 2003/0125917 A1* | 7/2003 | Rich et al. ..................... 703/14 |

* cited by examiner

*Primary Examiner*—Jack Chiang
*Assistant Examiner*—Suresh Memula
(74) *Attorney, Agent, or Firm*—Winston Hsu

(57) ABSTRACT

A method for reducing standard delay format (SDF) file size is disclosed. The state-dependent descriptions in cell descriptions of the SDF file, which are not intended to be used, are removed by referring to a design description of an integrated circuit design. Therefore, the SDF file size is reduced and the simulation result generated by a simulator is not affected with the reduced SDF file.

5 Claims, 2 Drawing Sheets

METHOD FOR REDUCING STANDARD DELAY FORMAT FILE SIZE

BACKGROUND OF INVENTION

1. Field of the Invention

The present invention relates to a Standard Delay Format (abbreviated as SDF hereinafter) file, and more particularly, to a method for reducing a SDF file size.

2. Description of Related Art

Along with the continuous development of the semiconductor technology, the Integrated Circuit (abbreviated as IC hereinafter) has become a most important electronic component in various devices. In order to simplify the IC design process, many IC design tools running on computer have been developed to assist the designer to design IC.

FIG. 1 is a flow chart illustrating a typical IC design process. As shown in the diagram, the IC designer first uses a high level language such as Verilog or VHDL to describe functions provided by the IC, and a RTL file 110 is generated after the description is appropriately edited. The RTL file 110 is then fed into a synthesizer 120, and the RTL file 110 is converted into a netlist 140 with the cell level by referring a timing library 130 provided by the semiconductor manufacture. Besides containing the cells which can achieve the IC functions, the netlist 140 further contains an interconnect, which describes the connection between cells, and both of them are used in the IC layout design.

Wherein, in order to simulate the functions of the IC design before manufacturing the IC, a delay calculator 150 shown in the diagram is used to generate a SDF file 170 which is required by a simulator 190 to perform a simulation by referring to the netlist 140 and the timing library 130. The SDF file 170 generally contains the delay time of the transmitted signal for the I/O paths of cells and the connections between cells. Before the layout is completed, the value of the delay time is only estimated. However, after the layout is completed, a RC extraction data 145 generated by a RC extractor is referred to calculate a delay time with more precise value. The RC extraction data 145 is the data associated to the physical resistance and capacitance extracted by the RC extractor. Afterwards, a simulation result is output by the simulator 190 according to the netlist 140, the SDF file 170, mentioned above, and a simulation model 180.

However, for a cell with more than two I/O paths, a cell description in the SDF file 170 also contains a state-dependent description. Since the amount of the state-dependent descriptions grows along with the increase of the number of the cell input terminals. For example, for a cell with two input terminals, the delay data of each I/O path contains two state-dependent descriptions, and for a cell with three input terminals, the delay data of each I/O path contains four state-dependent descriptions, such that the simulator 190 can determine the physical delay time according to the status of the cell input terminals when it is performing the simulation. Accordingly, it is not easy to reduce the size of the SDF file 170.

SUMMARY OF INVENTION

In the light of the preface, the present invention is directed to a method of reducing a SDF file size such that the simulation result generated by a simulator is unaffected by the reduced size of the SDF file.

The method, according to an embodiment of the present invention, is suitable for reducing a size of the SDF file complied with an IEEE 1497 standard, for example, by referring to a design description such as the netlist mentioned above. According to an embodiment of the present invention, first, a cell description is read from the SDF file. Next, whether or not the read cell description contains a state-dependent description is determined. In other words, the delay data of each cell's I/O path is described by a description associated to different input state of the cell; and if it is determined that the state-dependent description is present in the cell description, the state-dependent descriptions in the cell description, which are not intended to be used, are removed by referring to a state data which is contained in the design description and is associated to the cell description.

Wherein, if it is determined that the state-dependent description is not present in the cell description, the cell description is kept unchanged in the SDF file.

Wherein, if it is determined that the state-dependent description is present in the cell description and there is no delay data description for the state which is not intended to be used, the cell description is also kept unchanged in the SDF file.

It is known from the descriptions mentioned above, when the method for reducing the SDF file size provided by the present invention is applied, since the state-dependent descriptions in the cell descriptions of the SDF file, which are not intended to be used, had been removed, it is possible to reduce the SDF file size and the simulation result generated by the simulator is not affected with the reduced SDF file.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
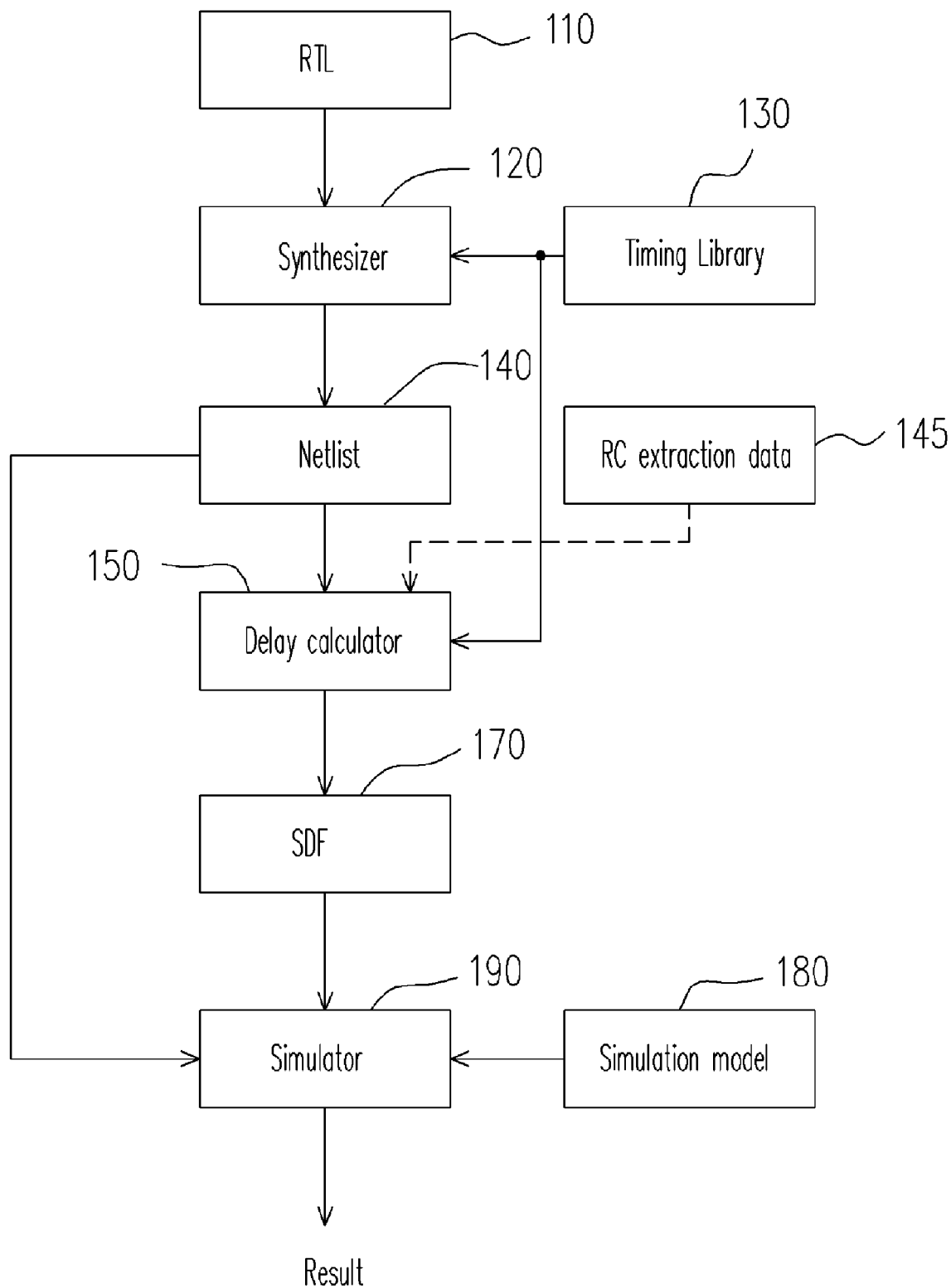
FIG. 1 is a flow chart illustrating a typical IC design process.
Figure 2:
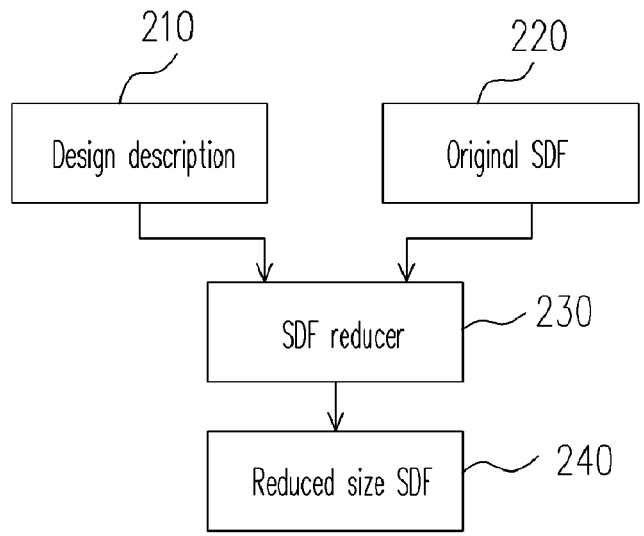
FIG. 2 is a schematic diagram illustrating inputs and outputs of a method of reducing the SDF file size according to an embodiment of the present invention.

FIG. 2 is a schematic diagram illustrating inputs and outputs of a method of reducing the SDF file size according to an embodiment of the present invention. As shown in the diagram, the SDF reducer 230 deployed in a method for reducing the SDF file size, according to an embodiment of the present invention, to remove the state-dependent descriptions, which are not intended to be used, from the cell descriptions of the original SDF file 220 such as IEEE 1497 SDF file, by referring to a design description 210, such as, a netlist, so as to generate a reduced size SDF file 240 such that the simulation result generated by a simulator is not affected with the reduced SDF file.

For a cell with more than two I/O paths, it is common that the cell description of the SDF file contains a state-dependent description. The so-called state-dependent description herein indicates that a delay data of the I/O path is described by a description associated to different input status of the cell. For example, if a logic AND gate named as A and having two input terminals I1, I2 and an output terminal Y is deployed by the IC design, the IC's SDF file may contain a cell description as follows:

```
(CELL
    (CELLTYPE "AND2")
    (INSTANCE A)
    (DELAY
        (ABSOLUTE
            (COND (I1==0)
                (IOPATH I2 Y (2:2:2) (3:3:3))
            )
            (COND) (I1--1)
                (IOPATH I2 Y (1:1:1) (2:2:2))
            )
            (COND (I2==0)
                (IOPATH I1 Y (2:2:2) (3:3:3))
            )
            (COND (I2==1)
                (IOPATH I1 Y (1:1:1) (2:2:2))
            )
        )
    )
)
```

The SDF file mentioned above contains 4 state-dependent descriptions with COND, wherein I1=0, I1=1, I2=0, and I2=1 subsequent to COND indicates different logic state of the input terminals I1 and I2, respectively, and the value subsequent to IOPATH is the delay time of the I/O path from I1 to Y or from I2 to Y. Such complete cell description is only required in the case where the status of the input terminals I1 and I2 of cell A is unknown. If it is possible to acquire a firm status of either the input terminal I1 or I2 of the cell A by referring to a design description of the IC, for example, by referring to a netlist, the other state which is not intended to be used will not be used by the simulator. Therefore, the SDF file is not required any more, thus it should be removed to reduce the SDF file size.

For example, if the input terminal I1 of the cell A in the SDF file mentioned above is directly grounded, the state of I1==1 should not occur. In such case, the state-dependent description of I1==1 should be removed, and the remaining state-dependent descriptions should be kept unchanged. A cell description for removing the unused state-dependent descriptions is as follows:

```
(CELL
    (CELLTYPE "AND2")
    (INSTANCE A)
    (DELAY
        (ABSOLUTE
            (COND (I1==0)
                (IOPATH I2 Y (2:2:2) (3:3:3))
            )
            (COND (I2--0)
                (IOPATH I1 Y (2:2:2) (3:3:3))
            )
            (COND (I2==1)
                (IOPATH I1 Y (1:1:1) (2:2:2))
            )
        )
    )
)
```

Figure 3:
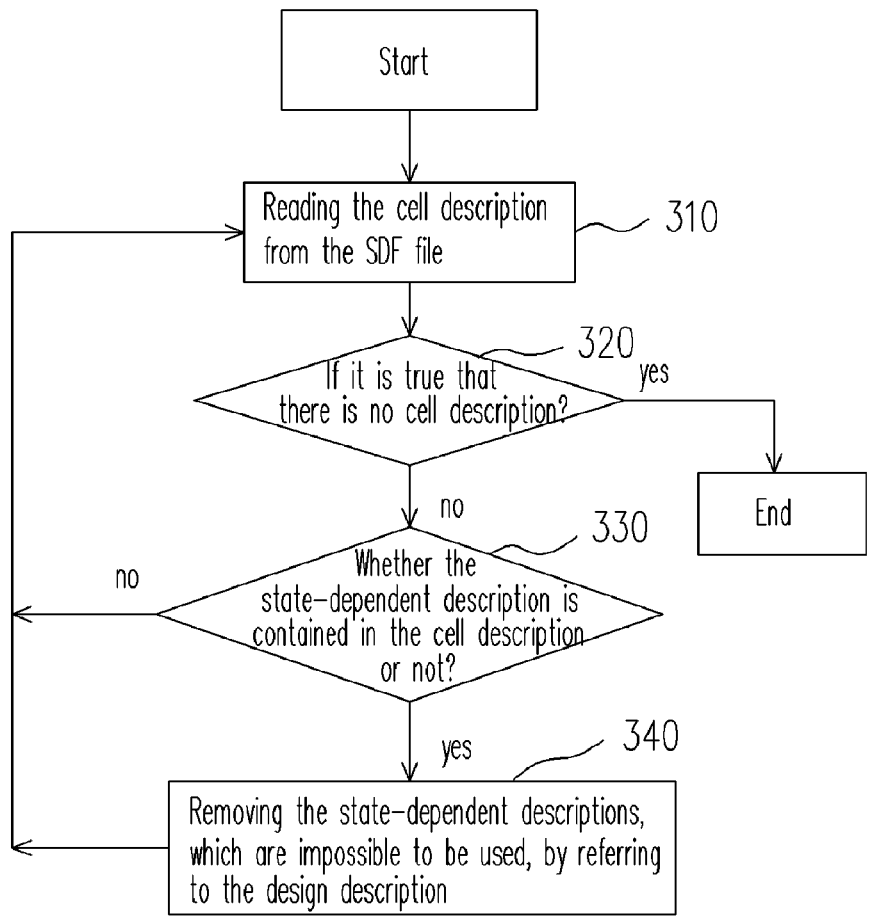
FIG. 3 is a flow chart illustrating a method of reducing the SDF file size according to an embodiment of the present invention.

FIG. 3 is a flow chart illustrating a method for reducing the SDF file size according to an embodiment of the present invention. The detail steps of the method of reducing the SDF file size are described hereinafter. First, in step 310, a cell description is read from a SDF file. Then, in step 320, it is determined whether the SDF file contains no cell description. If there is no cell description needs to be processed, the operation of reducing the SDF file size is completed. Otherwise, the process proceeds to step 330 where whether a state-dependent description is present in the read cell description is determined.

If it is determined that the state-dependent description is present in the cell description, the process proceeds to step 340, where the state-dependent descriptions in the cell description, which are not intended to be used, are removed by referring to a state data which is present in the IC design description and is associated to the cell description, so as to reduce the SDF file size.

Wherein, if the state-dependent description is not present in the cell description, or the state-dependent description is present in the cell description, and the result obtained from referring the IC design description indicates that there is no delay data description for the state which is not intended to be used, the cell description is kept unchanged in the SDF file, such that the accuracy of the simulation result is not affected with the reduced SDF file.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

The invention claimed is:

1. A method of reducing an SDF file size, comprising:
   reading a cell description from the SDF file;
   determining whether or not a state-dependent description is present in the cell description; and
   removing the state-dependent description in the cell description, which is not intended to be used, by referring to a state data contained in a design description associated to the cell description when it is determined that the state-dependent description is present in the cell description, wherein the state-dependent description is a description associated to an input status of a cell described in the design description.

2. The method of reducing the SDF file size of claim 1, wherein when the state-dependent description is not present in the cell description, the cell description is kept unchanged in the SDF file.

3. The method of reducing the SDF file size of claim 1, wherein when the state-dependent description is present in the cell description and each delay data described by the state-dependent description is intended to be used, the cell description is kept unchanged in the SDF file.

4. The method of reducing the SDF file size of claim 1, wherein the design description is a netlist.

5. The method for reducing the SDF file size of claim 1, wherein the SDF file is an IEEE 1497 SDF file.

* * * * *